United States Patent
Pindl et al.

(10) Patent No.: US 10,879,427 B2
(45) Date of Patent: Dec. 29, 2020

(54) METHOD OF PRODUCING AN OPTOELECTRONIC COMPONENT, AND OPTOELECTRONIC COMPONENT

(71) Applicant: OSRAM OLED GmbH, Regensburg (DE)

(72) Inventors: Markus Pindl, Tegernheim (DE); Matthias Sperl, Mintraching (DE)

(73) Assignee: OSRAM OLED GmbH, Regensburg (DE)

( * ) Notice: Subject to any disclaimer, the term of this patent is extended or adjusted under 35 U.S.C. 154(b) by 35 days.

(21) Appl. No.: 15/779,310

(22) PCT Filed: Nov. 29, 2016

(86) PCT No.: PCT/EP2016/079152
§ 371 (c)(1),
(2) Date: Oct. 4, 2018

(87) PCT Pub. No.: WO2017/093262
PCT Pub. Date: Jun. 8, 2017

(65) Prior Publication Data
US 2019/0157514 A1  May 23, 2019

(30) Foreign Application Priority Data
Dec. 1, 2015 (DE) .......... 10 2015 120 855

(51) Int. Cl.
*H01L 33/48* (2010.01)
*H01L 33/50* (2010.01)
*H01L 33/52* (2010.01)

(52) U.S. Cl.
CPC .......... *H01L 33/486* (2013.01); *H01L 33/502* (2013.01); *H01L 33/52* (2013.01);
(Continued)

(58) Field of Classification Search
CPC ..... H01L 33/486; H01L 33/502; H01L 33/52; H01L 2933/0041; H01L 2933/005
See application file for complete search history.

(56) References Cited

U.S. PATENT DOCUMENTS

2014/0220714 A1   8/2014  Sorimachi
2016/0093780 A1*  3/2016  Beppu .................. H01L 33/50
                                                             257/98

FOREIGN PATENT DOCUMENTS

DE    10 2007 053 067 A1   4/2009
DE    10 2013 212 928 A1   1/2015
(Continued)

*Primary Examiner* — Marcos D. Pizarro
*Assistant Examiner* — Antonio B Crite
(74) *Attorney, Agent, or Firm* — DLA Piper LLP (US)

(57) ABSTRACT

A method of producing an optoelectronic component includes providing a carrier; securing a sheet including a wavelength-converting material on a top side of the carrier; arranging a grid structure on a top side of the sheet; arranging an optoelectronic semiconductor chip in an opening of the grid structure on the top side of the sheet; arranging a potting material on the top side of the sheet, wherein the grid structure and the optoelectronic semiconductor chip are at least partly embedded into the potting material, and a composite body including the potting material, the sheet, the grid structure and the optoelectronic semiconductor chip is formed; and detaching the composite body from the carrier.

3 Claims, 6 Drawing Sheets

(52) U.S. Cl.
CPC .................. *H01L 2933/005* (2013.01); *H01L 2933/0033* (2013.01); *H01L 2933/0041* (2013.01)

(56) References Cited

FOREIGN PATENT DOCUMENTS

| | | |
|---|---|---|
| WO | 2015/014874 A1 | 2/2015 |
| WO | 2015/014875 A1 | 2/2015 |

\* cited by examiner

METHOD OF PRODUCING AN OPTOELECTRONIC COMPONENT, AND OPTOELECTRONIC COMPONENT

TECHNICAL FIELD

This disclosure relates to a method of producing an optoelectronic component and an optoelectronic component.

BACKGROUND

Optoelectronic components comprising various housing forms are known. There is nonetheless a need to provide an improved method of producing optoelectronic components and improved optoelectronic component.

SUMMARY

We provide a method of producing an optoelectronic component including providing a carrier; securing a sheet including a wavelength-converting material on a top side of the carrier; arranging a grid structure on a top side of the sheet; arranging an optoelectronic semiconductor chip in an opening of the grid structure on the top side of the sheet; arranging a potting material on the top side of the sheet, wherein the grid structure and the optoelectronic semiconductor chip are at least partly embedded into the potting material, and a composite body including the potting material, the sheet, the grid structure and the optoelectronic semiconductor chip is formed; and detaching the composite body from the carrier.

We also provide an optoelectronic component including a composite body including a molded body, an optoelectronic semiconductor chip embedded into the molded body, a grid structure embedded into the molded body, and a layer of a wavelength-converting material adjoining a front side of the molded body, wherein the optoelectronic semiconductor chip is arranged in an opening of the grid structure, and a front side of the optoelectronic semiconductor chip and a front side of the grid structure terminate flush with the front side of the molded body.

LIST OF REFERENCE SIGNS

10 Optoelectronic component
100 Carrier
101 Top side
110 Releasable adhesive film
111 First side
112 Second side
200 Wavelength-converting sheet
201 Top side
202 Underside
210 First covering layer
220 Second covering layer
300 Grid structure
301 Front side
302 Rear side
303 Thickness
310 Opening
311 Area
315 Perforation
320 Structuring
400 Optoelectronic semiconductor chip
401 Front side
402 Rear side
403 Thickness
404 Area
410 Electrical contact pad
500 Potting material
510 Molded body
511 Front side
512 Rear side
600 Composite body
700 Further film
710 Separating plane

DETAILED DESCRIPTION

Our method of producing an optoelectronic component comprises steps of providing a carrier, securing a sheet comprising a wavelength-converting material on a top side of the carrier, arranging a grid structure on a top side of the sheet, arranging an optoelectronic semiconductor chip in an opening of the grid structure on the top side of the sheet, arranging a potting material on the top side of the sheet, wherein the grid structure and the optoelectronic semiconductor chip are at least partly embedded into the potting material, wherein a composite body comprising the potting material, the sheet, the grid structure and the optoelectronic semiconductor chip is formed, and detaching the composite body from the carrier.

This method makes it possible to produce an optoelectronic component comprising advantageously very compact external dimensions. The dimensions of the composite body of the optoelectronic component obtainable by the method may extend only slightly beyond the dimensions of the optoelectronic semiconductor chip. The grid structure embedded into the potting material may advantageously bring about a mechanical stabilization and stiffening of the optoelectronic component obtainable by the method. This makes it easier to carry out the further processing steps of the production method and reduces the risk of damage to the optoelectronic component. In addition, the grid structure embedded into the potting material may serve as a reflector for electromagnetic radiation emitted by the optoelectronic semiconductor chip and may thereby bring about beam shaping. The production method is advantageously implementable in a simple, rapid and cost-effective manner. The carrier used in the method may advantageously be formed in a simple manner. In particular, the carrier used in the method advantageously need not be suitable for a molding process (mold process).

The opening of the grid structure may comprise an area 10% to 30% larger than the area of a front side of the optoelectronic semiconductor chip. Advantageously, the grid structure thereby closely encloses the front side of the optoelectronic semiconductor chip, as a result of which the grid structure brings about only a slight increase in the necessary minimum size of the composite body of the optoelectronic component obtainable by the method. At the same time, the larger area of the opening of the grid structure compared with the area of the front side of the optoelectronic semiconductor chip enables simple positioning of the optoelectronic semiconductor chip in the opening of the grid structure. In this case, the grid structure may advantageously additionally serve as a reference system to align the optoelectronic semiconductor chip.

The grid structure may be arranged by laminating on the top side of the sheet. This advantageously enables a pre-structuring of the grid structure, as a result of which the method is implementable in a simple and cost-effective manner.

The grid structure may comprise, in a direction perpendicular to the top side of the sheet, a thickness smaller than the thickness of the optoelectronic semiconductor chip. Advantageously, it is thereby very simple to arrange the optoelectronic semiconductor chip in the opening of the grid structure.

The grid structure may comprise, in a direction perpendicular to the top side of the sheet, a thickness of 20 µm to 100 µm. Advantageously, the grid structure thereby comprises on the one hand a sufficient thickness to bring about mechanical stabilization and stiffening of the composite body, but on the other hand a sufficiently small thickness to enable a simple arrangement of the optoelectronic semiconductor chip in the opening of the grid structure on the top side of the sheet.

The grid structure may be provided with a front side comprising a structuring. In this case, the grid structure is arranged such that the front side of the grid structure faces the top side of the sheet. The front side of the grid structure is then exposed at a front side of the optoelectronic component obtainable by the method. The structuring of the front side of the grid structure may thereby influence an emission characteristic of the optoelectronic component obtainable by the method.

The structuring may comprise a sawtooth structure extending at least partly around the opening of the grid structure. Advantageously, the structuring of the front side of the grid structure in the optoelectronic component obtainable by this method may bring about focusing of the electromagnetic radiation emitted by the optoelectronic semiconductor chip of the optoelectronic component.

Securing the sheet on the top side of the carrier may comprise steps of arranging a releasable adhesive film on the top side of the carrier and arranging the sheet on the adhesive film, by the adhesive film being detached from the carrier. In this case, the composite body is detached from the carrier. The adhesive film may be, for example, a thermally releasable adhesive film or an adhesive film that is releasable by UV irradiation. Advantageously, the method thereby enables the composite body of the optoelectronic component obtainable by the method to be detached simply from the carrier used in the method.

The sheet may be provided as a sheet of a material comprising silicone and wavelength-converting particles embedded into the silicone. As a result, the sheet may, in the optoelectronic component obtainable by the method, convert an electromagnetic radiation emitted by the optoelectronic semiconductor chip at least partly into electromagnetic radiation comprising a different wavelength. Since the material of the sheet comprises silicone, the sheet may advantageously comprise a stickiness that simplifies arranging the optoelectronic semiconductor chip on the top side of the sheet. As a result, the method may advantageously be carried out in a particularly simple manner.

The optoelectronic semiconductor chip may be arranged on the sheet such that a front side of the optoelectronic semiconductor chip, the front side forming a radiation emission face, faces the sheet. As a result, the sheet in the optoelectronic component obtainable by the method is arranged above the radiation emission face of the optoelectronic semiconductor chip, thereby enabling at least part of an electromagnetic radiation emitted by the optoelectronic semiconductor chip at the radiation emission face to be converted into electromagnetic radiation comprising a different, for example, longer, wavelength in the sheet.

Arranging the potting material may be carried out such that a rear side of the optoelectronic semiconductor chip is not covered by the potting material. Advantageously, the rear side of the optoelectronic semiconductor chip and electrical contact pads of the optoelectronic semiconductor chip arranged on the rear side of the optoelectronic semiconductor chip thereby remain free. This enables the optoelectronic semiconductor chip of the optoelectronic component obtainable by the method to be electrically contacted via the electrical contact pads arranged on the rear side of the optoelectronic semiconductor chip.

The method may comprise a further step of arranging the composite body on a further film such that the sheet faces away from the further film. The further film may serve, for example, as a carrier during a subsequent method step of dividing the composite body.

The grid structure may be provided with a plurality of openings. In this case, a plurality of optoelectronic semiconductor chips are arranged on the sheet. In this case, the composite body is formed such that it comprises all the optoelectronic semiconductor chips. Advantageously, the method thereby enables parallel production of a plurality of optoelectronic components in common work processes. The production outlay per optoelectronic component decreases as a result.

The method may comprise a further step of dividing the composite body. In this case, the composite body may be divided such that each part of the composite body comprises at least one optoelectronic semiconductor chip. As a result, optoelectronic components produced jointly in a composite assembly may be separated from one another.

Dividing the composite body may be carried out along separating planes extending through perforations of the grid structure. Advantageously, the perforations arranged in the grid structure facilitate dividing the composite body and the grid structure forming a part of the composite body. The perforations may additionally advantageously reduce formation of burrs in the region of the separating planes.

Our optoelectronic component comprises a composite body comprising a molded body, an optoelectronic semiconductor chip embedded into the molded body, a grid structure embedded into the molded body, and a layer of a wavelength-converting material adjoining a front side of the molded body. In this case, the optoelectronic semiconductor chip is arranged in an opening of the grid structure. A front side of the optoelectronic semiconductor chip and a front side of the grid structure terminate flush with the front side of the molded body.

Advantageously, the composite body of this optoelectronic component may form a housing comprising very compact external dimensions. The dimensions of the composite body forming the housing of the optoelectronic component may be only slightly larger than the dimensions of the optoelectronic semiconductor chip. In this optoelectronic component, the grid structure forming a part of the composite body advantageously brings about mechanical stabilization and stiffening of the composite body forming the housing, as a result of which the optoelectronic component may comprise a high robustness. The grid structure embedded into the molded body may additionally serve to influence an emission characteristic of the optoelectronic component.

A rear side of the optoelectronic semiconductor chip may terminate flush with a rear side of the molded body. As a result, the rear side of the optoelectronic semiconductor chip is exposed at the rear side of the composite body forming a housing of the optoelectronic component that enables the optoelectronic component to be electrically contacted via electrical contacts pads arranged on the rear side of the optoelectronic semiconductor chip.

A rear side of the grid structure may be covered by the molded body. Advantageously, short circuits caused by the grid structure are prevented as a result.

The front side of the grid structure may comprise a structuring. The structuring may influence an emission characteristic of the optoelectronic component.

The structuring may comprise a sawtooth structure extending at least partly around the opening of the grid structure. As a result, the structuring of the front side of the grid structure may advantageously bring about focusing of electromagnetic radiation emitted by the optoelectronic semiconductor chip of the optoelectronic component.

The above-described properties, features and advantages and the way in which they are achieved will become clearer and more clearly understood in association with the following description of the examples explained in greater detail in association with the drawings.

Figure 1:
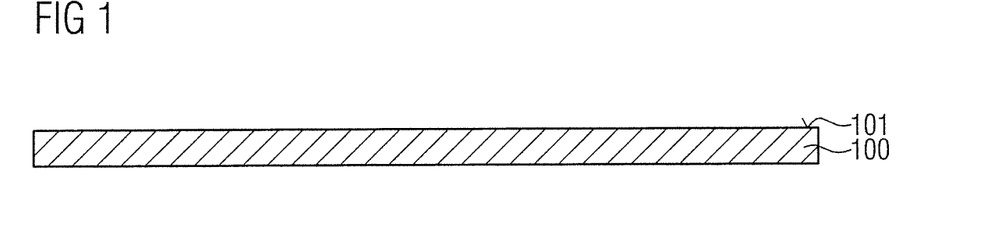
FIG. 1 schematically shows a sectional side view of a carrier.

FIG. 1 shows a schematic sectional side view of a carrier 100. The carrier 100 comprises a planar top side 101. The carrier 100 may be formed, for example, as a sheet. The carrier 100 may comprise, for example, a glass, high-grade steel, aluminum or an alloy.

Figure 2:
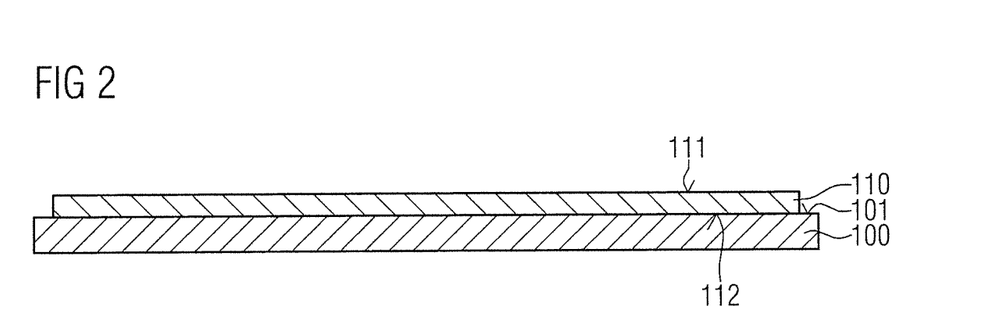
FIG. 2 schematically shows the carrier with an adhesive film arranged thereon.

FIG. 2 shows a schematic sectional side view of the carrier 100 in a processing state temporally succeeding the illustration in FIG. 1.

A releasable adhesive film 110 is arranged on the top side 101 of the carrier 100. The releasable adhesive film 110 comprises a first side 111 and a second side 112 opposite the first side 111. Both the first side 111 and the second side 112 of the releasable adhesive film 110 are formed in adhesive fashion. The second side 112 of the releasable adhesive film 110 is arranged on the top side 101 of the carrier 100. The adhesive film may be, for example, a thermally releasable adhesive film or an adhesive film releasable by UV irradiation. The adhesive bond between the second side 112 of the releasable adhesive film 110 and the top side 101 of the carrier 100 may then be released by a thermal treatment or by UV irradiation.

Figure 3:
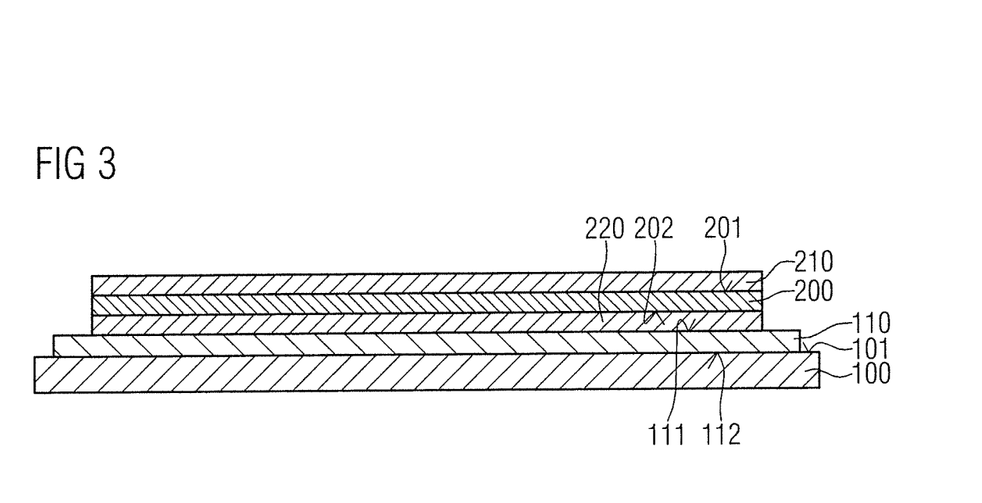
FIG. 3 schematically shows the carrier and the adhesive film with a wavelength-converting sheet arranged thereon.

FIG. 3 shows a schematic sectional side view of the carrier 100 and the releasable adhesive film 110 in a processing state temporally succeeding the illustration in FIG. 2.

By the releasable adhesive film 110, a wavelength-converting sheet 200 is secured on the top side 101 of the carrier 100. The wavelength-converting sheet 200 comprises a material configured to convert electromagnetic radiation comprising a wavelength from a first spectral range, the electromagnetic radiation entering the wavelength-converting sheet 200, at least partly into electromagnetic radiation comprising a wavelength from a second spectral range. The wavelength-converting sheet 200 may comprise in particular a material comprising silicone and wavelength-converting particles embedded into the silicone. In this case, the material of the wavelength-converting sheet may be present in a not fully cured state.

The wavelength-converting sheet 200 comprises a top side 201 and an underside 202 opposite the top side 201. The top side 201 and the underside 202 of the wavelength-converting sheet 200 may each comprise a slight stickiness. The top side 201 of the wavelength-converting sheet 200 is covered by a first covering layer 210 for protection against contamination. The underside 202 of the wavelength-converting sheet 200 is covered by a second covering layer 220 for protection against contamination. The covering layers 210, 220 may also be referred to as liner.

The wavelength-converting sheet 200 is arranged on the first side 111 of the releasable adhesive film 110 such that the underside 202 of the wavelength-converting sheet 200 faces the releasable adhesive film 110 and thus also the top side 101 of the carrier 100. The second covering layer 220 arranged on the underside 202 of the wavelength-converting sheet 200 is thus laminated onto the first side 111 of the releasable adhesive film 110.

The wavelength-converting sheet 200 may comprise, for example, a thickness of 20 µm to 150 µm.

The covering layers 210, 220 may comprise, for example, a plastics material. The covering layers 210, 220 may be formed, for example, as polymer films, in particular, for example, as fluoropolymer films. It is expedient that the covering layers 210, 220 comprise a low adhesion to the material of the wavelength-converting sheet 200.

Figure 4:
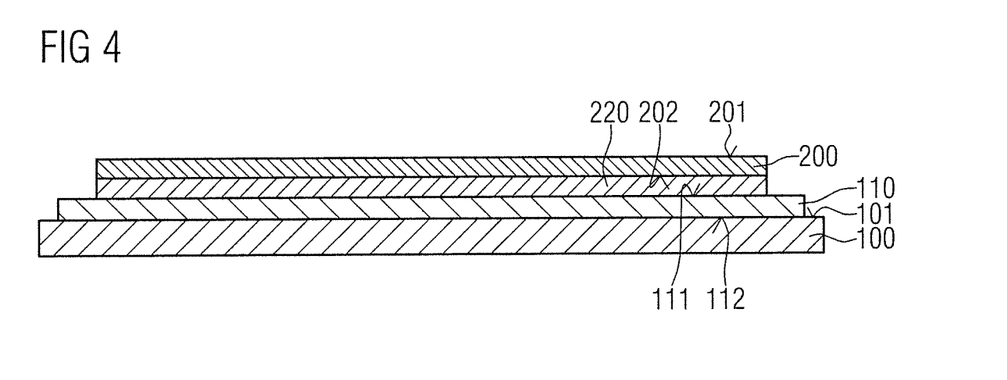
FIG. 4 schematically shows the wavelength-converting sheet after a first covering layer has been detached.

FIG. 4 shows a schematic sectional side view of the carrier 100, the releasable adhesive film 110 and the wavelength-converting sheet 200 in a processing state temporally succeeding the illustration in FIG. 3.

The first covering layer 210, which previously was still situated on the top side 201 of the wavelength-converting sheet 200, has been removed. Removing the first covering layer 210 may have been carried out, for example, by simple pulling off.

Figure 5:
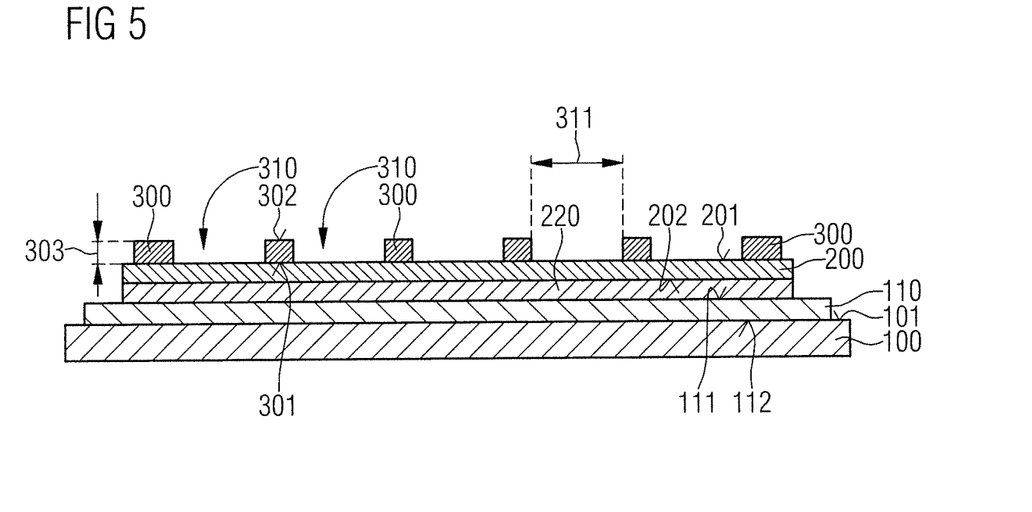
FIG. 5 schematically shows a grid structure arranged above a top side of the wavelength-converting sheet.

FIG. 5 shows a schematic sectional side view of the carrier 100, the releasable adhesive film 110 and the wavelength-converting sheet 200 in a processing state temporally succeeding the illustration in FIG. 4.

Figure 6:
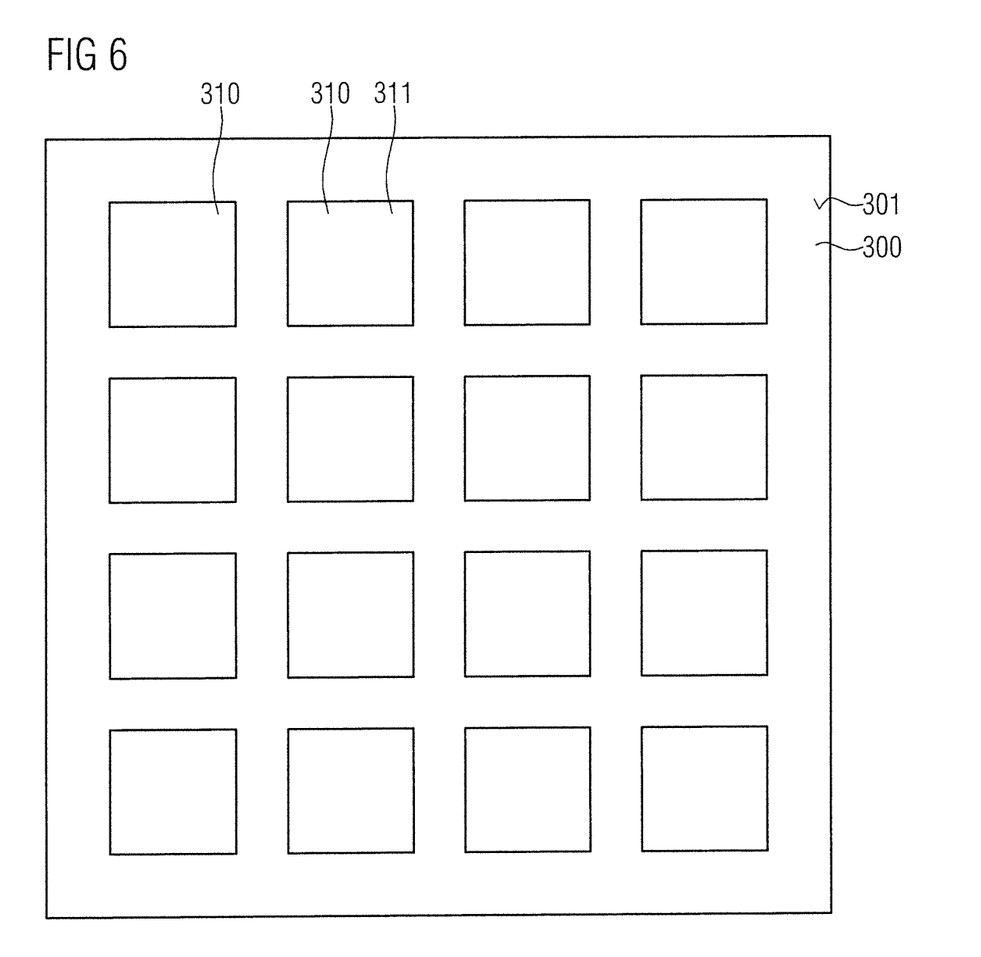
FIG. 6 schematically shows a plan view of the grid structure.
Figure 7:
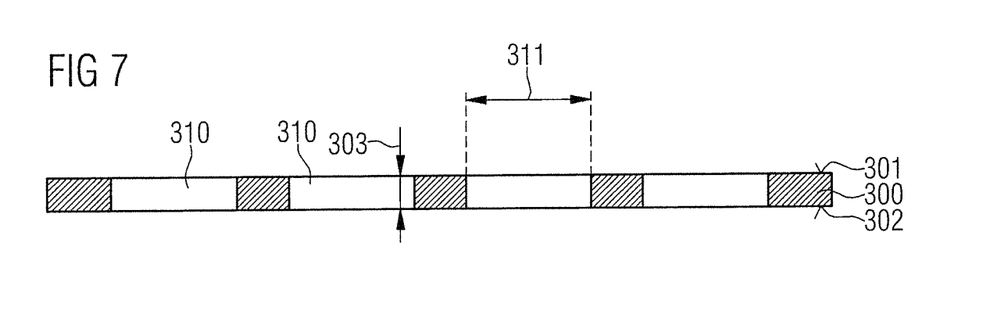
FIG. 7 schematically shows a sectional side view of the grid structure.

A grid structure 300 has been arranged on the top side 201 of the wavelength-converting sheet 200. FIG. 6 shows a schematic plan view of a front side 301 of the grid structure 300. FIG. 7 shows a schematic sectional side view of the grid structure 300.

The grid structure 300 is formed as a flat, planar and substantially two-dimensional grid comprising a plurality of openings 310 each extending from the front side 301 of the grid structure 300 through the grid structure 300 to a rear side 302 of the grid structure 300 opposite the front side 301. It is expedient that the openings 310 of the grid structure 300 are arranged in a regular two-dimensional pattern, for example, in a rectangular matrix arrangement. It is expedient that the openings 310 of the grid structure 300 comprise rectangular cross sections. By way of example, the openings 310 of the grid structure 300 may comprise square cross sections.

It is expedient that the grid structure 300 comprises a material comprising high optical reflectivity. In particular, it is expedient that the front side 301 of the grid structure 300 comprises a high optical reflectivity. The grid structure 300 may comprise, for example, a metal or a plastic. In particular, the grid structure 300 may comprise, for example, copper and/or silver, PEEK, PPA or a white epoxy resin.

The grid structure 300 may already have been structured, that is to say have been provided in particular with the openings 310, before being arranged on the top side 201 of the wavelength-converting sheet 200. The openings 310 may have been created, for example, by a stamping method or an etching method.

Arranging the grid structure 300 on the top side 201 of the sheet 200 may have been carried out, for example, by laminating. The grid structure 300 may be held on the top side 201 of the wavelength-converting sheet 200 by virtue of the presence of a stickiness of the top side 201 of the wavelength-converting sheet 200. The grid structure 300 has been arranged on the top side 201 of the wavelength-converting sheet 200 such that the front side 301 of the grid structure 300 faces the top side 201 of the wavelength-converting sheet 200 and is in contact with the top side 201 of the wavelength-converting sheet 200. The front side 301 of the grid structure 300 is formed in planar fashion in the case of the example of the grid 300 shown in FIGS. 5 to 7.

The grid structure 300 comprises a thickness 303 measured in the direction from its front side 301 to its rear side 302. The thickness 303 may be, for example, 20 µm to 100 µm. In particular, the thickness 303 may be, for example, 50 µm.

Figure 8:
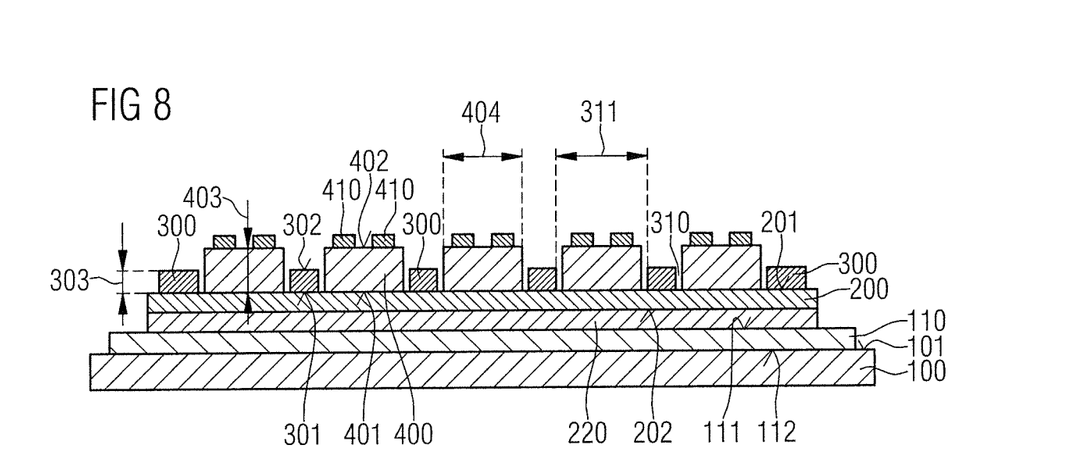
FIG. 8 schematically shows a sectional side view of the carrier, the adhesive film, the wavelength-converting sheet, the grid structure and optoelectronic semiconductor chips arranged in openings of the grid structure on the top side of the sheet.

FIG. 8 shows a schematic sectional side view of the carrier 100, the releasable adhesive film 110, the wavelength-converting sheet 200 and the grid structure 300 in a processing state temporally succeeding the illustration of FIG. 5.

On the top side 201 of the wavelength-converting sheet 200, a plurality of optoelectronic semiconductor chips 400 have been arranged in the openings 310 of the grid structure 300. The optoelectronic semiconductor chips 400 are configured to emit electromagnetic radiation, for example, visible light. In this case, the optoelectronic semiconductor chips 400 are configured to emit electromagnetic radiation comprising one wavelength that may be converted by the wavelength-converting sheet 200 at least partly into electromagnetic radiation comprising another wavelength. The optoelectronic semiconductor chips 400 may be configured, for example, to emit electromagnetic radiation comprising a wavelength from the blue or ultraviolet spectral range. The optoelectronic semiconductor chips 400 may be, for example, light emitting diode chips (LED chips).

In the example illustrated in FIG. 8, the optoelectronic semiconductor chips 400 are configured as sapphire flip-chips. Each optoelectronic semiconductor chip 400 comprises a front side 401 forming a radiation emission face. The front side 401 may be formed at a sapphire side of the respective optoelectronic semiconductor chip 400. During operation of the respective optoelectronic semiconductor chip 400, at least part of the electromagnetic radiation emitted by the optoelectronic semiconductor chip 400 is emitted at the front side 401 forming the radiation emission face. In addition, electromagnetic radiation may also be emitted at other faces of the optoelectronic semiconductor chips 400. The optoelectronic semiconductor chips 400 might alternatively also be configured, for example, as surface emitting flip-chips.

Furthermore, each optoelectronic semiconductor chip 400 comprises a rear side 402 opposite the front side 401. Electrical contact pads 410 of the optoelectronic semiconductor chips 400 are arranged on the rear side 402, via which contact pads the respective optoelectronic semiconductor chip 400 may be electrically contacted and have electrical current and/or electrical voltage applied to it.

The optoelectronic semiconductor chips 400 have been arranged on the top side 202 of the wavelength-converting sheet 200 such that the front sides 401 of the optoelectronic semiconductor chips 400 face the top side 201 of the wavelength-converting sheet 200 and are in contact therewith. In this case, the optoelectronic semiconductor chips 400 may be held at their respective positions by a stickiness of the top side 201 of the wavelength-converting sheet 200.

The optoelectronic semiconductor chips 400 have been arranged in the openings 310 of the grid structure 300. In this case, one optoelectronic semiconductor chip 400 is arranged in each opening 310 of the grid structure 300.

It is expedient that the openings 310 of the grid structure 300 comprise a shape similar to the shape of the front sides 401 of the optoelectronic semiconductor chips 400. By way of example, both the openings 310 of the grid structure 300 and the front sides 401 of the optoelectronic semiconductor chips 400 may be formed in rectangular fashion, in particular in square fashion.

In this case, each opening 310 of the grid structure 300 comprises an area 311 somewhat larger than an area 404 of the front side 401 of the associated optoelectronic semiconductor chip 400. As a result, the optoelectronic semiconductor chips 400 are arranged at a distance from the grid structure 300 in the openings 310 of the grid structure 300. By way of example, the areas 311 of the openings 310 of the grid structure 300 may be 10% to 30% larger than the areas 404 of the front sides 401 of the optoelectronic semiconductor chips 400. By way of example, the front sides 401 of the optoelectronic semiconductor chips 400 may each comprise an area 404 of 1000 µm×1000 µm. The openings 310 of the grid structure 300 may each comprise, for example, an area 311 of 1100 µm×1100 µm.

Arranging the optoelectronic semiconductor chips 400 on the top side 201 of the wavelength-converting sheet 200 may have been carried out, for example, by a die attach method. In this case, the openings 310 of the grid structure 300 may have been used for local alignment of the optoelectronic semiconductor chip 400.

Each optoelectronic semiconductor chip 400 comprises a thickness 403 measured in the direction from its front side 401 to its rear side 402. It is expedient that the thickness 303 of the grid structure 300 is smaller than the thickness 403 of the optoelectronic semiconductor chip 400. The rear side 402 of the optoelectronic semiconductor chips 400 arranged on the top side 201 of the wavelength-converting sheet 200 then project beyond the rear side 302 of the grid structure 300 arranged at the top side 201 of the wavelength-converting sheet 200.

After arranging the optoelectronic semiconductor chips 400 on the top side 201 of the wavelength-converting sheet 200, a further method step may be carried out to cure the material of the wavelength-converting sheet 200. In this case, curing the material of the wavelength-converting sheet 200 may be carried out, for example, by a thermal treatment or irradiation with light of a defined wavelength.

Figure 9:
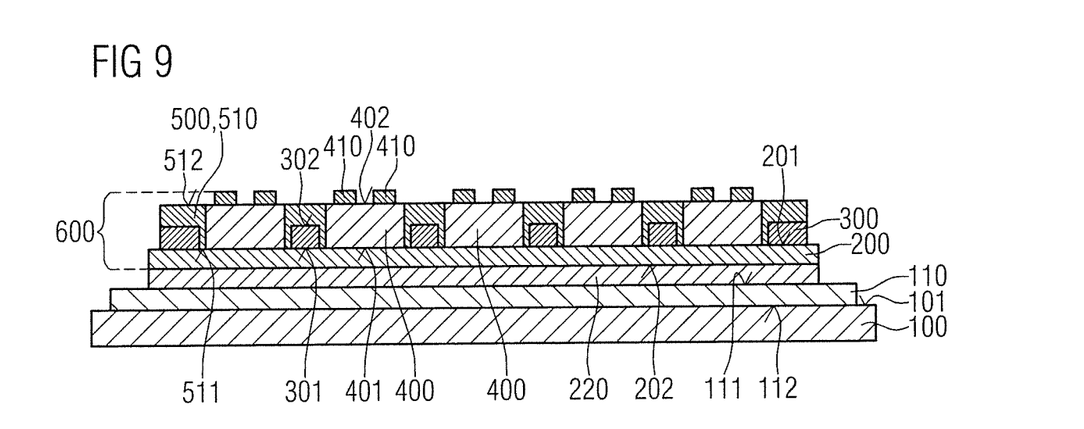
FIG. 9 schematically shows a composite body formed by embedding the optoelectronic semiconductor chips and the grid structure into a potting material.

FIG. 9 shows a schematic sectional side view of the carrier 100, the releasable adhesive film 110, the wavelength-converting sheet 200, the grid structure 300 and the optoelectronic semiconductor chips 400 in a processing state temporally succeeding the illustration in FIG. 8.

A potting material 500 has been arranged on the top side 201 of the wavelength-converting sheet 200. In this case, the grid structure 300 arrange d on the top side 201 of the wavelength-converting sheet 200 and the optoelectronic semiconductor chips 400 arranged on the top side 201 of the wavelength-converting sheet 200 have been at least partly embedded into the potting material 500. The rear side 302 of the grid structure 300 and side faces of the grid structure 300 extending between the front side 301 and the rear side 302 are at least partly covered by the potting material 500. Side faces of the optoelectronic semiconductor chips 400 extending between the front sides 401 and the rear sides 402 of the optoelectronic semiconductor chips 400 are also at least partly covered by the potting material 500. By contrast, the rear sides 402 of the optoelectronic semiconductor chips 400 remain free and not covered by the potting material 500 at least to an extent such that the electrical contact pads 410 arranged on the rear sides 402 of the optoelectronic semiconductor chips 400 are still accessible. The potting material 500 also adjoins the top side 201 of the wavelength-converting sheet 200.

The potting material 500 forms a molded body 510 into which the grid structure 300 and the optoelectronic semiconductor chips 400 are at least partly embedded. The molded body 510 comprises a front side 511 adjoining the top side 201 of the wavelength-converting sheet 200, and a rear side 512 opposite the front side 511. It is expedient that the rear sides 402 of the optoelectronic semiconductor chips 400 terminate approximately flush with the rear side 512 of the molded body 510. By contrast, the rear side 302 of the grid structure 300 is covered by the molded body 510. The front sides 401 of the optoelectronic semiconductor chips 400 and the front side 301 of the grid structure 300 terminate flush with the front side 511 of the molded body 510. The molded body 510 formed by the potting material 500, the grid structure 300 embedded into the molded body 510, the optoelectronic semiconductor chips 400 embedded into the molded body 510 and the wavelength-converting sheet 200 together form a composite body 600.

The potting material 500 and the molded body 510 formed from the potting material 500 may comprise a high optical reflectivity. The potting material 500 may comprise, for example, a silicone or an epoxy resin. Moreover, the potting material 500 may comprise embedded particles, for example, optically reflective particles, for example, particles comprising $TiO_2$.

The potting material 500 may be arranged, for example, in flowable form on the top side 201 of the wavelength-converting sheet 200 above the grid structure 300 and between the optoelectronic semiconductor chips 400. For this purpose, a dam enclosing the grid structure 300 and the optoelectronic semiconductor chips 400 on the top side 201 of the wavelength-converting sheet 200 may be provided beforehand. Arranging the potting material 500 may be carried out, for example, by a metering method, in particular, for example, by a non-contact metering method. By way of example, the potting material 500 may be arranged by jetting. If the previous provision of a dam was dispensed with, then the potting material 500 is expediently arranged in viscous form on the top side 201 of the wavelength-converting sheet 200 to prevent excessive running of the potting material 500.

After arranging the potting material 500 on the top side 201 of the wavelength-converting sheet 200, a further method step of curing the molded body 510 formed from the potting material 500 may be carried out. Curing the molded body 510 may be carried out, for example, by a thermal treatment or irradiation with light of a defined wavelength. It is possible to cure the material of the wavelength-converting sheet 200 and the molded body 510 formed from the potting material 500 in a common processing step.

Figure 10:
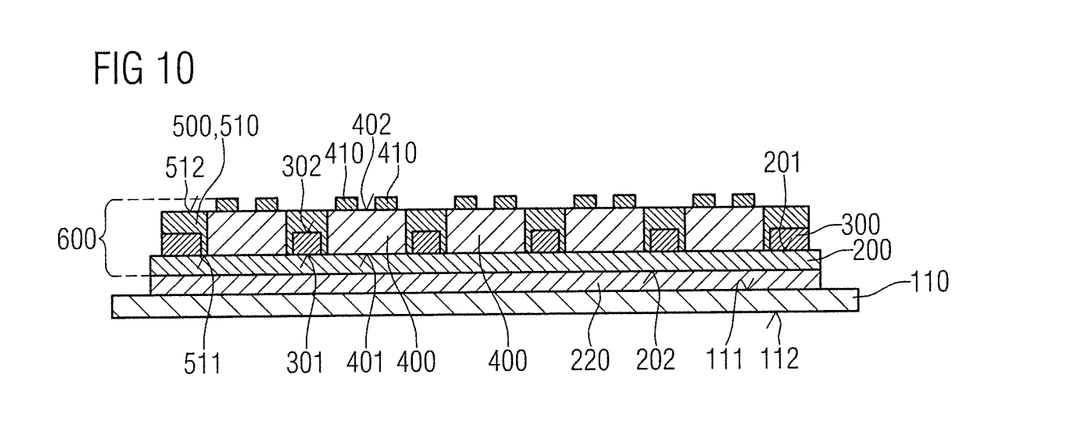
FIG. 10 schematically shows the composite body after detaching the carrier.

FIG. 10 shows a schematic sectional side view of the composite body 600 in a processing state temporally succeeding the illustration in FIG. 9.

The composite body 600 is detached from the top side 101 of the carrier 100. This is carried out by detaching the releasable adhesive film 110 from the top side 101 of the carrier 100. For this purpose, the adhesive bond between the second side 112 of the releasable adhesive film 110 and the top side 101 of the carrier 100 is released. Detaching the composite body 600 from the top side 101 of the carrier 100 may be facilitated by virtue of the grid structure 300 embedded into the molded body 510 bringing about mechanical stabilization and stiffening of the composite body 600 comprising the molded body 510. In the processing state shown in FIG. 10, the first side 111 of the releasable adhesive film 110 is connected to the second covering layer 220 arranged on the underside 202 of the wavelength-converting sheet 200.

Figure 11:
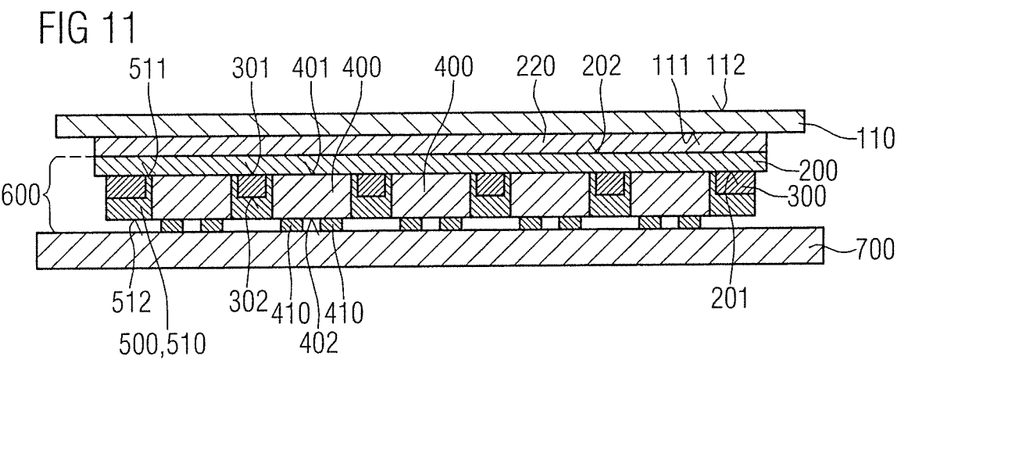
FIG. 11 schematically shows the composite body after arranging on a further film.

FIG. 11 shows a schematic sectional side view of the composite body 600 and the releasable adhesive film 110 in a processing state temporally succeeding the illustration in FIG. 10.

The composite body 600 is arranged on a further film 700. In this case, the composite body 600 is arranged such that the rear sides 402 of the optoelectronic semiconductor chip 400 face the further film 700 and the wavelength-converting sheet 200 faces away from the further film 700. The composite body 600 may be connected to the further film 700, for example, by an adhesive bond. The further film 700 may also be referred to as a dicing film.

Figure 12:
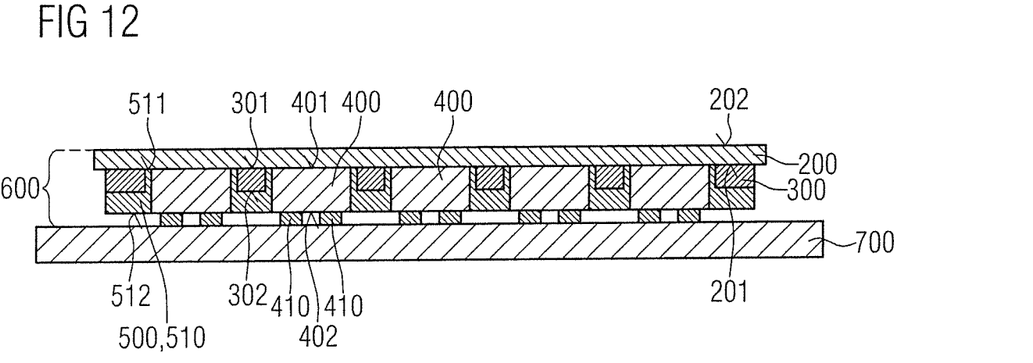
FIG. 12 schematically shows the composite body after detaching the adhesive film and a second covering layer from the wavelength-converting sheet.

FIG. 12 shows a schematic sectional side view of the composite body 600 arranged on the further film 700 in a processing state temporally succeeding the illustration in FIG. 11.

The second covering layer 220 previously arranged on the underside 202 of the wavelength-converting sheet 200 and the releasable adhesive film 110 connected to the second covering layer 220 is detached from the composite body 600. Detaching may be carried out, for example, by pulling off the second covering layer 220 from the underside 202 of the wavelength-converting sheet 200.

Figure 13:
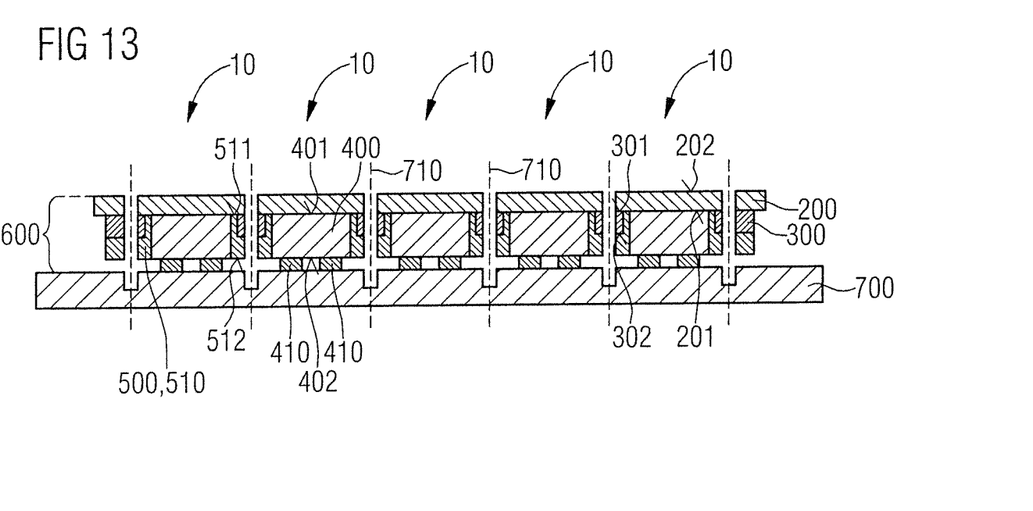
FIG. 13 schematically shows a plurality of optoelectronic components formed by dividing the composite body.

FIG. 13 shows a schematic sectional side view of the composite body 600 arranged on the further film 700 in a processing state temporally succeeding the illustration in FIG. 12.

The composite body 600 is divided along separating planes 710 extending perpendicularly to the further film 700. Dividing the composite body 600 may be carried out, for example, by sawing, laser separating or stamping. Each part of the composite body 600 produced as a result of the dividing comprises at least one embedded optoelectronic semiconductor chip 400 and forms an optoelectronic component 10.

Figure 14:
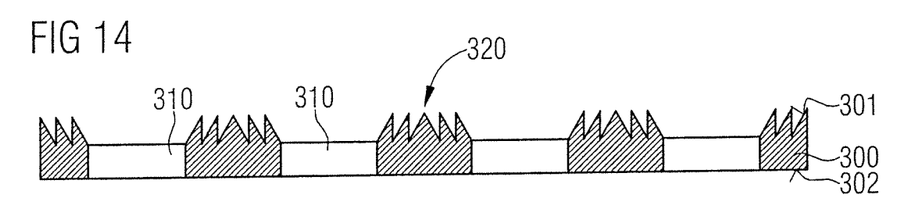
FIG. 14 schematically shows a sectional side view of an alternative example of the grid structure.

FIG. 14 shows a schematic sectional side view of an alternative example of the grid structure 300. The example of the grid structure 300 as shown in FIG. 14 may be used in the method described with reference to FIGS. 1 to 13 instead of the example of the grid structure 300 as shown in FIGS. 6 and 7.

The example of the grid structure 300 shown in FIG. 14 differs from the example of the grid structure 300 shown in FIGS. 6 and 7 in that the grid structure 300 comprises a structuring 320 at its front side 301. The front side 301 of the grid structure 300 is thus not formed in planar fashion. In the example shown in FIG. 14, the structuring 320 comprises sawtooth structures extending at least partly around the openings 310 of the grid structure 300. The sawtooth structures may enclose the openings 310 of the grid structure 300 radially symmetrically, for example. The sawtooth structures of the structuring 320 at the front side 301 of the grid structure 300 may, in the optoelectronic components 10, focus electromagnetic radiation emitted by the optoelectronic semiconductor chips 400 by virtue of the sawtooth structures reflecting obliquely emitted electromagnetic radiation in the direction of an optical center. The structuring 320 on the front side 301 of the grid structure 300 might also be formed differently.

Figure 15:
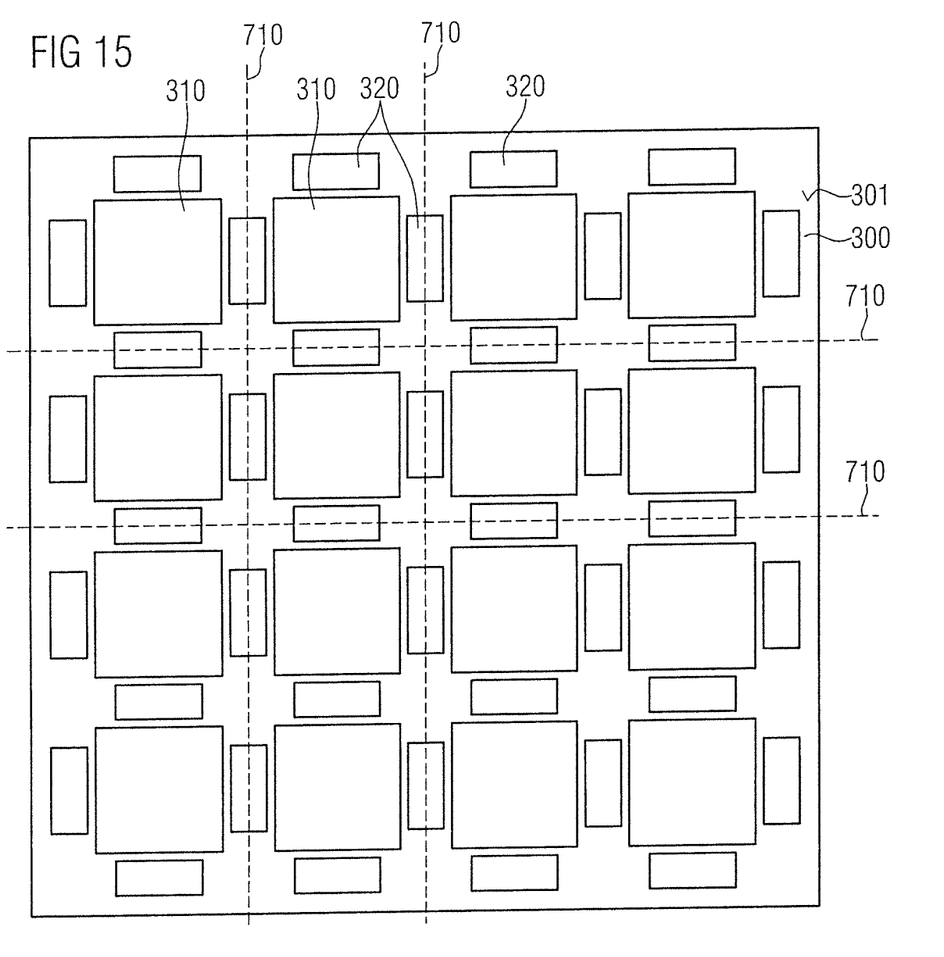
FIG. 15 schematically shows a plan view of a further alternative example of the grid structure.

FIG. 15 shows a schematic plan view of the front side 301 of a further alternative example of the grid structure 300. The example of the grid structure 300 shown in FIG. 15 may be used in the method described with reference to FIGS. 1 to 13 instead of the example of the grid structure 300 shown in FIGS. 6 and 7.

The example of the grid structure 300 shown in FIG. 15 differs from the example of the grid structure 300 shown in FIGS. 6 and 7 by additional perforations 315 arranged between the openings 310 of the grid structure 300 and each extending between the front side 301 and the rear side 302 through the grid structure 300. The perforations 315 may be created, for example, together with the openings 310 in the grid structure 300.

The perforations 315 are arranged such that the separating planes 710 along which the composite body 600 is divided in the method step described in association with FIG. 13 extend through the perforations 315. The perforations 315 thereby facilitate separating the composite body 600 by their facilitating dividing the grid structure 300 forming a part of the composite body 600. In particular, providing the perforations 315 may enable use of a higher sawing speed. Moreover, the perforations 315 prevent excessive burr formation during the process of dividing the grid structure 300 forming a part of the composite body 600.

A further example of the grid structure 300 comprises both the structuring 320 formed on the front side 301 and the perforations 315.

Our components and methods have been illustrated and described in greater detail on the basis of preferred examples. Nevertheless, this disclosure is not restricted to the examples disclosed. Rather, other variations may be derived therefrom by those skilled in the art, without departing from the scope of protection of the appended claims.

This application claims priority of DE 10 2015 120 855.5, the subject matter of which is incorporated herein by reference.

The invention claimed is:

1. An optoelectronic component comprising:
    a composite body comprising a molded body,
    an optoelectronic semiconductor chip embedded into the molded body,
    a grid structure embedded into the molded body, and
    a layer of a wavelength-converting material adjoining a front side of the molded body,
    wherein the optoelectronic semiconductor chip is arranged in an opening of the grid structure,
    a front side of the optoelectronic semiconductor chip and a front side of the grid structure terminate flush with the front side of the molded body, and
    a rear side of the optoelectronic semiconductor chip terminates flush with a rear side of the molded body.

2. The optoelectronic component according to claim 1, wherein a rear side of the grid structure is covered by the molded body.

3. The optoelectronic component according to claim 1, wherein the front side of the grid structure comprises a structuring.

* * * * *